(12) United States Patent
Tsai

(10) Patent No.: US 9,893,680 B2
(45) Date of Patent: Feb. 13, 2018

(54) REGULATING CASCODE CIRCUIT WITH SELF-CALIBRATION CAPABILITY

(75) Inventor: Tsung-Hsien Tsai, Kaohsiung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 1409 days.

(21) Appl. No.: 13/468,587

(22) Filed: May 10, 2012

(65) Prior Publication Data

US 2013/0300382 A1    Nov. 14, 2013

(51) Int. Cl.
*G05F 1/00* (2006.01)
*H03F 1/22* (2006.01)

(52) U.S. Cl.
CPC .................... *H03F 1/223* (2013.01)

(58) Field of Classification Search
CPC .................... H03F 1/223; G05F 3/02
USPC ........ 323/270, 312, 313; 327/530, 538, 543, 327/540
See application file for complete search history.

(56) References Cited

U.S. PATENT DOCUMENTS

| | | | | |
|---|---|---|---|---|
| 5,942,947 A * | 8/1999 | Bhagwan | ................ | H03L 7/085 331/10 |
| 7,576,613 B2 * | 8/2009 | Jung | ....................... | H03F 3/345 330/264 |
| 8,183,914 B2 * | 5/2012 | Tsai et al. | ..................... | 327/543 |
| 2003/0169112 A1 * | 9/2003 | Takahashi | ............ | H03G 1/0023 330/254 |
| 2005/0007198 A1 * | 1/2005 | Versteegen | ......... | H03F 3/45475 330/264 |
| 2009/0257276 A1 * | 10/2009 | Huang | ................ | G11C 27/005 365/185.2 |

OTHER PUBLICATIONS

Mansuri, Mozhgan, et al., "A Low-Power Adaptive Bandwidth PLL and Clock Buffer with Supply-Noise Compensation", IEEE Journal of Solid-State Circuits, vol. 38, No. 11, Nov. 2003, pp. 1804-1802.

* cited by examiner

*Primary Examiner* — Jue Zhang
*Assistant Examiner* — Afework Demisse
(74) *Attorney, Agent, or Firm* — Hauptman Ham, LLP

(57) ABSTRACT

A circuit comprises a cascode core circuit and a current adjustor circuit. The cascode core circuit has an output node and a current path (ID). The current adjustor circuit is configured to change a current on the current path in response to a change in a voltage at the output node. The cascode core circuit comprises a first transistor, a second transistor, and a third transistor. A first terminal of the first transistor is coupled to a second terminal of the second transistor and to a third terminal of the third transistor. A first terminal of the second transistor is configured as the output node. A first terminal of the third transistor is coupled to a third terminal of the second transistor. The current path is through the first terminal of the third transistor.

20 Claims, 13 Drawing Sheets

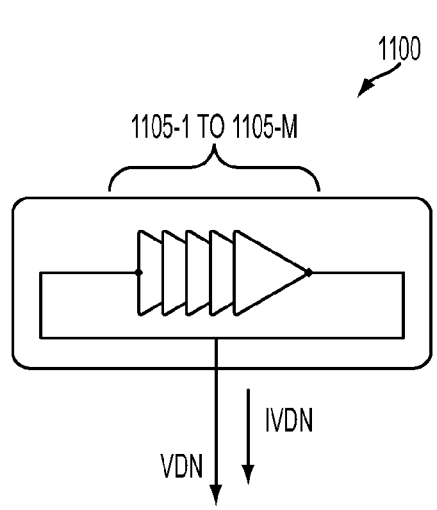
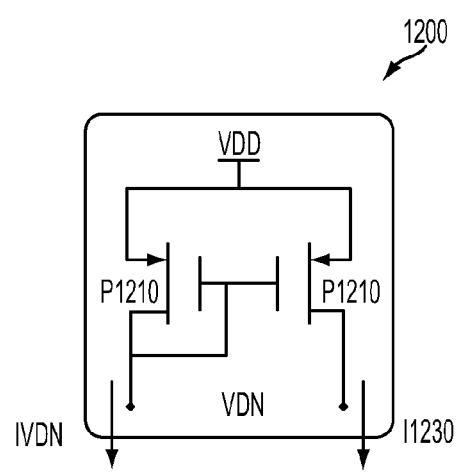
FIG. 11
FIG. 12

1400

| DEVICE PROCESS (P) | SUPPLY VOLTAGE (V) | TEMPERATURE (T) IN °C |
|---|---|---|
| TT | 1.0*VDD | 25 |
| | | 125 |
| | | -40 |
| | 0.9*VDD | 25 |
| | | 125 |
| | | -40 |
| | 1.1*VDD | 25 |
| | | 125 |
| | | -40 |
| SS | 1.0*VDD | 25 |
| | | 125 |
| | | -40 |
| | 0.9*VDD | 25 |
| | | 125 |
| | | -40 |
| | 1.1*VDD | 25 |
| | | 125 |
| | | -40 |
| FF | 1.0*VDD | 25 |
| | | 125 |
| | | -40 |
| | 0.9*VDD | 25 |
| | | 125 |
| | | -40 |
| | 1.1*VDD | 25 |
| | | 125 |
| | | -40 |

REGULATING CASCODE CIRCUIT WITH SELF-CALIBRATION CAPABILITY

FIELD

The present disclosure is related to a regulating cascode circuit with self-calibration capability.

BACKGROUND

Voltage controlled oscillators (VCOs) usually include a regulating cascode circuit and a current controlled oscillator (CCO). In an existing VCO using a low input-output (IO) supply voltage, some transistors in the regulating cascode circuit function out of a saturation mode at some process, voltage, and temperature (PVT) conditions or corners. In such a situation, the power supply rejection ratio (PSRR) of the VCO is decreased and affects performance of the phase lock loop (PLL) having the VCO.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 11 is a diagram of a circuit implementing the application circuit in FIG. 7, in accordance with some embodiments.

FIG. 12 is a diagram of a circuit implementing the application circuit in FIG. 7, in accordance with some further embodiments.

FIG. 14 is a table illustrating various process, voltage, and temperature corners in which the circuit in FIG. 1 operates, in accordance with some embodiments.

Like reference symbols in the various drawings indicate like elements.

DETAILED DESCRIPTION

Figure 1:
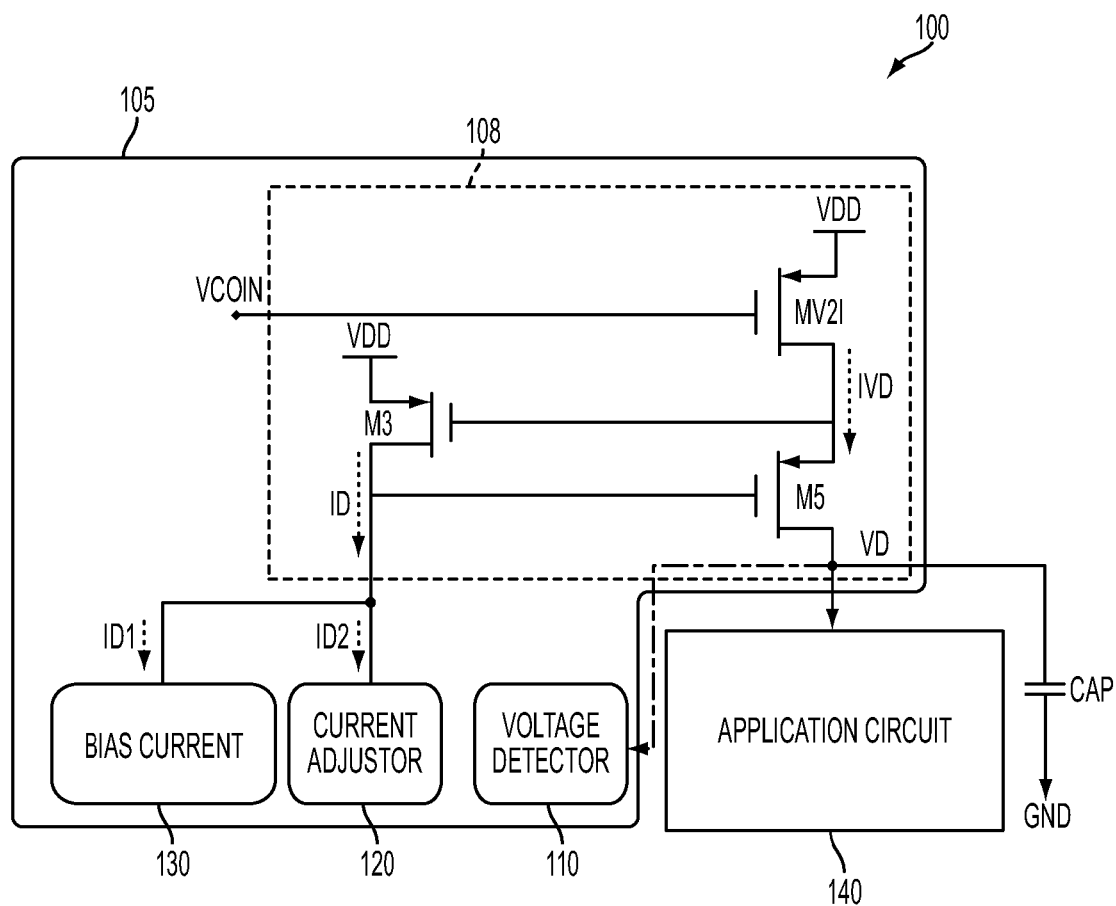
FIG. 1 is a diagram of a circuit having a cascode core circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A head voltage of a ring oscillator is detected. A bias current of a regulating cascode circuit is adjusted. As a result, transistors in the regulating cascode circuit continue to function in the saturation region. Various embodiments of the present disclosure are applicable for low supply voltage applications. For example, in some embodiments having a nominal operational voltage of 2.5V, a low voltage of 1.8 V is used. In some embodiments, a single N-type metal oxide semiconductor (NMOS) transistor functions as both a voltage detector and a current adjustor. A power supply rejection ratio (PSRR) gains 7.4 dB higher than that of an existing approach. The PSRR of a voltage controlled oscillator (VCO) is less than −60 dB for different process, voltage, and temperature (PVT) corners.

In a semiconductor manufacturing process, some transistors are typical or normal transistors, and are called in the typical corner or manufactured by a typical process. Some transistors switch faster than the typical transistors, and are called in the fast corner or manufactured by a fast process. Some transistors switch slower than the typical transistors, and are called in the slow corner or manufactured by a slow process. In this document, a first letter in a term having two letters corresponds to a PMOS transistor while a second letter corresponds to an NMOS transistor. For example, a reference TT refers to a PMOS transistor and an NMOS transistor in the typical corner. A reference FF refers to a PMOS and an NMOS transistor in the fast corner, and a reference SS refers to a PMOS and an NMOS transistor in the slow corner.

Circuit Having a Cascode Core

FIG. 1 is a diagram of a circuit 100 in accordance with some embodiments. To avoid obscuring the drawing, voltages VsgM3, VdMV2I, VsdMV2I, VodMV2I, VthMV2I, VmMV2I, VdM5, VsdM5, VodM5, VthM5 and VmM5 are not shown.

Voltage VsgM3 is a voltage drop between a source and a gate of transistor M3.

Voltage VdMV2I is a voltage at a drain of transistor MV2I. Voltage VsdMV2I is a voltage drop between a source and the drain of transistor MV2I. Voltage VodMV2I is an override voltage of transistor MV2I, which is a voltage difference between a voltage at a gate and a threshold voltage VthMV2I of transistor MV2I. Voltage VmMV2I or voltage margin VmMV2I is a difference between voltage VsdMV2I and voltage VodMV2I. Mathematically, VmMV2I=VsdMV2I−VodMV2I.

Voltage VdM5 is a voltage at a drain of transistor M5. Voltage VsdM5 is a voltage drop between a source and the drain of transistor M5. Voltage VodM5 is an override voltage of transistor M5, which is a voltage difference between a voltage at a gate and a threshold voltage VthM5 of transistor M5. Voltage VmM5 or voltage margin VmM5 is a difference between voltage VsdM5 and voltage VodM5. Mathematically, VmM5=VsdM5−VodM5.

Circuit 100 includes a regulating cascode circuit 105 used in conjunction with an application circuit 140. Application circuit 140 receives and functions based on a current IVD provided by regulating cascode circuit 105. For example, when application circuit 140 is a current controlled oscillator (CCO), regulating cascode circuit 105 together with application circuit 140 functions as, and is called, a voltage controlled oscillator (VCO). In such a condition, a voltage VD at the drain of transistor M5 is called the head voltage of the CCO. A capacitor CAP is a load capacitor for application circuit 140, and is used to stabilize voltage VD.

Regulating cascode circuit 105 receives a voltage VCOIN and provides current IVD to application circuit 140, and is therefore considered a current bias circuit for application circuit 140. Regulating cascode circuit 105 includes a cascode core circuit 108, a voltage detector 110, a current adjustor 120, and a current bias 130.

A current ID is called an operational current or bias current of cascode core 108. Current ID flows from the source to the drain of a PMOS transistor M3. Current ID changes when voltage VsgM3 changes, which in turn changes when voltage VD changes. In other words, both current ID and voltage VsgM3 depend on voltage VD. In some embodiments, when the absolute value of voltage VD increases, the absolute value of current ID and of voltage VsgM3 decrease.

Current IVD flows from the source to the drain of a PMOS transistor MV2I. When the absolute value of voltage VD increases, the absolute value of current IVD decreases. But when the absolute value of voltage VD decreases, the absolute value of current IVD increases.

Cascode core circuit 108 includes PMOS transistors MV2I, M3, and M5 that perform a cascoding function of regulating cascode circuit 105. Transistors MV2I and M5 are connected in a series or in a cascode manner. A source of PMOS transistor MV2I receives operational voltage VDD. A drain of PMOS transistor MV2I is coupled to a source of PMOS transistor M5. The drain of PMOS transistor M5 provides voltage VD for use by application circuit 140, and is called an output node of cascode core circuit 108. A gate of PMOS transistor MV2I receives voltage VCOIN, and is called an input node of cascode core circuit 108. The drain of transistor MV2I and the source of transistor M5 are also coupled to a gate of transistor M3. A drain of transistor M3 is coupled to the gate of transistor M5. A source of transistor M3 receives an operational voltage VDD.

Cascode core circuit 108 functions as a voltage-to-current converter. For example, cascode core circuit 108, based on voltage VCOIN at the gate of transistor MV2I, generates current IVD, which flows from the source to the drain of transistor MV2I. Current IVD then flows through the source and the drain of transistor M5, and is used by application circuit 140. For another example, when transistors M3, MV2I, and M5 operate in a saturation mode, transistor M3 functions as an amplifier. Transistor M3 then forces voltage VdMV2I at the drain of transistor MV2I to be at a fixed voltage. As a result, current IVD provided to application circuit 140 is a fixed current.

When transistor M5 and/or transistor MV2I operate out of the saturation mode into a triode mode, application circuit 140 operates in a slower frequency. In various embodiments of the present disclosure, both transistors MV2I and M5 and other circuitry in circuit 100 are designed such that transistors MV2I and M5 do not enter the triode mode, but remain in the saturation mode when the absolute value of voltage VCOIN decreases and/or the absolute value of voltage VD increases. For example, when the absolute value of voltage VCOIN decreases and/or the absolute value of voltage VD increases, the absolute value of voltage VsgM3, which is equal to the absolute value of voltage VsdMv2I, is designed to decrease, and is greater than the absolute value of voltage VodMV2I so that transistor MV2I continue to operate in the saturation mode. Voltage VsgM3 is also designed such that voltage VDD−voltage VsgM3−voltage VD is greater than the absolute value of voltage VodM5 so that transistor M5 continues to operate in the saturation mode. For another example, in some embodiments, the absolute value |ΔVsgM3| of voltage ΔVsgM3 is designed to be substantially equal to the absolute value of voltage |ΔVD|. Effectively, the amount of increase in the absolute value of voltage VD is substantially the same as the amount of decrease in the absolute value of voltage VsgM3.

Figure 3:
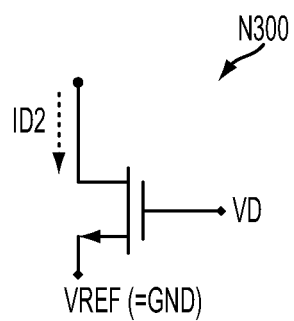
FIG. 3 is a diagram of a circuit functioning as a combined circuit of the voltage detector and the current adjustor in FIG. 2, in accordance with some embodiments.
Figure 4:
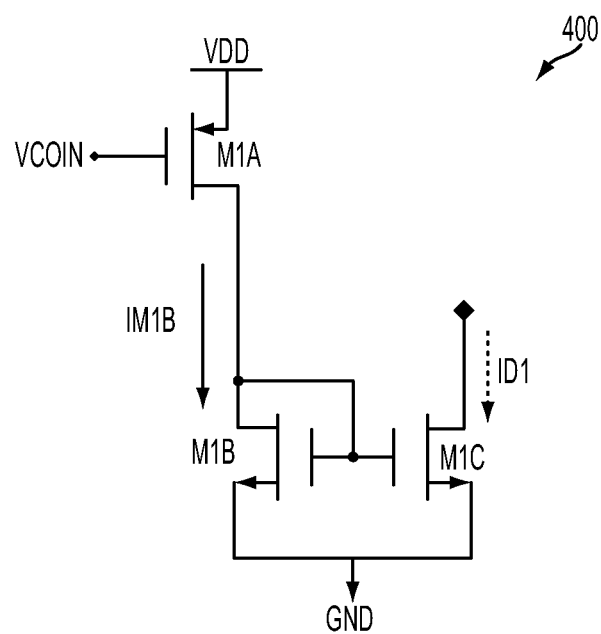
FIG. 4 is a diagram of a current bias in FIG. 1, in accordance with some embodiments.

When voltage VD changes, voltage detector 110 detects a change in voltage VD and provides the result to current adjustor 120 to adjust current ID2, or effectively, to adjust current ID. For illustration, at a particular voltage VCOIN, transistors MV2I and M5 operate in the saturation mode. For various reasons, the VCO formed by regulating cascode circuit 105 and the CCO functioning as application circuit 140 slows down. The absolute value of voltage VCOIN and of current IVD is decreased to compensate for the slow down of the VCO. In response to the decrease of the absolute value of current IVD, the CCO causes the absolute value of voltage VD to increase. Additionally, the absolute values of currents IVD, ID1, ID2 increase because:

$$IVD=KMV2I*(VsgMV2I-VthMV2I)^2=KMV2I*(VDD-VCOIN-VthMV2I)^2;$$

$$ID1=KM1A*(VsgM1A-VthM1A)^2=KM1A*(VDD-VCOIN-VthM1A)^2; \text{ and}$$

$$ID2=KN300*(VgsN300-VthN300)^2=KN300*(VD-VthN300)^2.$$

Where KMV2I, KM1A, and KN300 are constant values of corresponding transistors MV2I, M1A, and N300. Voltage VsgM1A is a voltage drop across the source and the gate of transistor M1A. Voltage VthM1A is the threshold voltage of transistor M1A. Voltage VgsN300 is a voltage drop across the gate and the source of transistor N300, and voltage VthN300 is the threshold voltage of transistor N300. Transistor N300 is shown in FIG. 3 while transistor M1A is shown in FIG. 4.

Because current ID is the difference between current ID1 and ID2 (ID=ID1−ID2), the absolute value of current ID decreases, which causes the absolute value of voltage VsgM3 or of voltage VsdMV2I to decrease, and the absolute value of voltage VsdM5 to increase. In some embodiments, the absolute value of voltage VsdM5 is designed to increase such that the absolute value of voltage VsdM5 is higher than the absolute value of voltage VodM5 by a predetermined voltage margin VmM5, such as 100 mV, at various operating PVT corners. As a result, transistor M5 continues to operate in the saturation mode. In other words, transistor M5 is prevented from leaving the saturation mode to enter the triode mode. At that time, the absolute value of voltage VsgM3 or of voltage VsdM2I is greater than the absolute value of voltage VodMV2I. As a result, transistor MV2I continues to function in the saturation mode. In some embodiments, the absolute value of voltage VsdMV2I is designed to be higher than the absolute value of voltage VodMV2I by a predetermined voltage margin VmMV2I, such as 100 mV, in various operating PVT corners.

Various embodiments of the present disclosure are advantageous over other existing approaches in which the transistor corresponding to transistor M5 and/or the transistor corresponding to transistor MV2I enter the triode mode when the absolute value of voltage VD increases.

In some embodiments, the absolute value of voltage VD in the SS corner is increased compared with the absolute value of voltage VD in the TT corner. As a result, without mechanisms of the present disclosure, transistor MV2I and/or transistor M5 could operate in the triode mode when transistor MV2I and/or transistor M5 are in the SS corner. In various embodiments, both transistors MV2I and M5 are designed such that transistors MV2I and M5 do not enter the triode mode when transistor MV2I and/or transistor M5 are in the SS corner. For illustration, a change in voltage VD from the TT corner to the SS corner is called voltage ΔVD and is obtained through simulation. Further, the absolute value of voltage VsgM3 in the SS corner is designed to be lower than the absolute value of voltage VsgM3 in the TT corner. Stated differently, the absolute value of voltage VsgM3 decreases. The decrease in the absolute value of voltage VsgM3 from the TT corner to the SS corner is called voltage ΔVsgM3. In some embodiments, ΔVsgM3 is designed to compensate for ΔVD. As a result, in the SS corner, transistors MV2I and M5 continue to operate in the saturation region.

In some embodiments, $$VsdMV2I = VsgM3;$$

$$VsdM5 = VDD - VsdMV2I - VD;\text{ and}$$

$$VsgM3 = \sqrt{\frac{ID}{K}} + VthM3,\ K = \frac{1}{2}\mu Cox(W/L).$$

Wherein VthM3 is the threshold voltage of transistor M3, K is a mathematical constant value of transistor M3, Cox is the oxide capacitance, µ is the electron mobility through the channel, W is the width, and L is the length of transistor M3.

In various embodiments, each of the absolute value of voltage VsdM5 and of voltage VsdMV2I is designed to be greater than the corresponding absolute value of override voltages VodM5 and VodMV2I to keep the corresponding transistors M5 and MV2I to operate in the saturation mode. In some embodiments, overdrive voltages VodM5 and VodMV2I are obtained through simulation.

Voltage detector 110 provides a voltage to current adjustor 120 based on voltage VD. Current adjustor 120, based the voltage provided by voltage detector 110, adjusts current ID2, and effectively, adjusts current ID, to keep transistor M5 operate in the saturation mode in different PVT corners. Details of voltage detector 110 and current adjustor 120 are described with reference to FIG. 2 and FIG. 3.

Current bias 130 generates current ID for cascode core circuit 108. Current bias 130 changes current ID based on current ID2. Current ID is the difference between current ID1 and current ID2, and depends on voltage VD at the drain of transistor M5.

Various embodiments of the disclosure are advantageous over some existing approaches. In those existing approaches, the transistors in the cascode core circuit operate out of the saturation mode into the triode mode in some PVT corners, such as at the temperature corner of −40° C.

As a result, the total resistance of the cascode core circuit in those existing approaches is reduced, resulting in a lower PSSR.

Further, transistors MV2I and M5 of the present disclosure operate in the saturation mode in the SS corner. For example, when transistors MV2I and M5 are in the SS corner, the absolute value of voltage VD is increased compared with the absolute value of voltage VD in the SS corners. The operation of circuit 100 in response to the increase in the absolute value of voltage VD is explained above. In other words, the absolute value of voltage VsgM3 is designed to decrease to keep transistors MV2I and M5 operate in the saturation mode as explained above. In contrast, in some existing approaches, transistors corresponding to transistors MV2I and/or M5 operate in the triode region in the SS corner.

Voltage Detector and Current Adjustor

Figure 2:
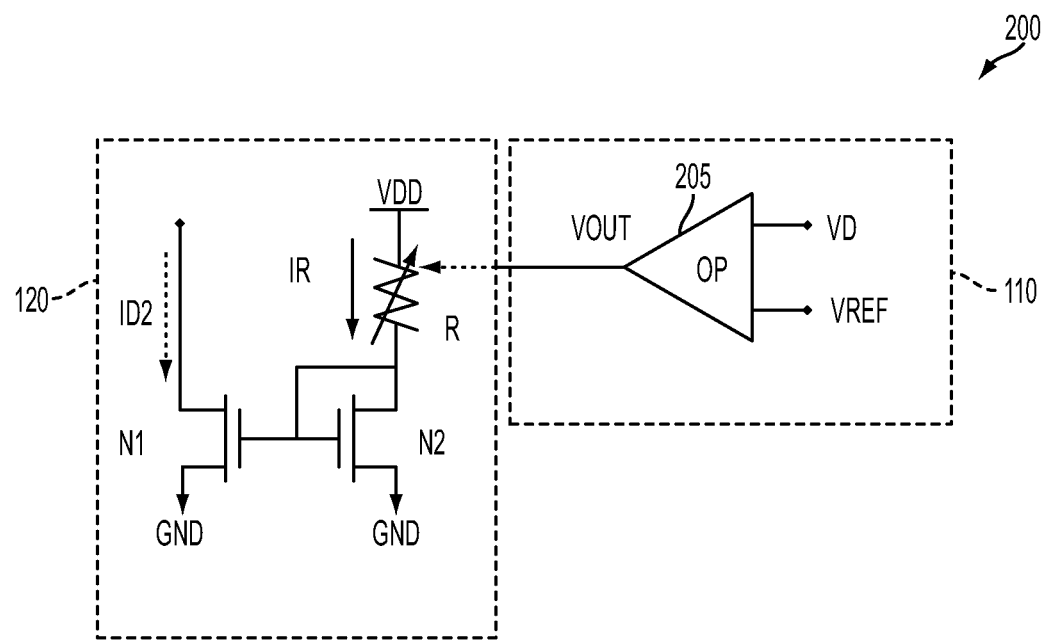
FIG. 2 is a diagram of a circuit implementing the voltage detector and the current adjustor in the circuit of FIG. 1, in accordance with some embodiments.

FIG. 2 is a diagram of a circuit 200, in accordance with some embodiments. Circuit 200 includes an implementation of voltage detector 110 and current adjustor 120 in FIG. 1.

Voltage detector 110 is implemented by an operational amplifier (OP) 205. OP 205 receives voltage VD and a reference voltage VREF as inputs, and generates a voltage VOUT. In some embodiments, reference voltage VREF is selected to be 0 V so that voltage VOUT is the difference between voltage VD and voltage VREF. Effectively, voltage VOUT is a change in voltage VD with reference to voltage VREF.

Mathematically, $$VOUT = VD - VREF.$$

Current adjustor 120 includes NMOS transistors N1, N2, and a resistor R. Current ID2 flows through a drain of transistor N1. A current IR flows through a drain of transistor N2. Transistors N1 and N2 form a current mirror because gates of transistors N1 and N2 are coupled together and to the drain of transistor N2. As a result, current ID2 equals current IR.

Resistor R is a voltage controlled resistor wherein a resistance of resistor R varies based on voltage VOUT. Effectively, a voltage value of voltage VOUT results in a corresponding resistance value of resistor R and a corresponding current value of current IR. Because current ID2 equals current IR, a voltage value of voltage VOUT results in a corresponding current value of current ID2. As current ID2 changes, current ID in FIG. 1 also changes. Effectively, current adjustor 120 adjusts current ID based on the change in voltage VD with reference to reference voltage VREF. For example, when the absolute value of voltage VD increases, the absolute value of voltage VOUT increases, and the resistance of resistor R decreases. An absolute value of a voltage dropped across resistor R decreases. An absolute value of a voltage dropped across the gate and the source of transistor N2, which is also a voltage dropped across the gate and the source of transistor N1, increases. As a result, the absolute value of current ID2 increases.

FIG. 3 is a circuit diagram an NMOS transistor N300, in accordance with some embodiments. Transistor N300 functions as both voltage detector 110 and current adjustor 120 in FIG. 1. In other words, transistor N300 functions as circuit 200 in FIG. 2. Reference voltage VREF is at the source of transistor N300 while voltage VD is at a gate of transistor N300. Current ID2 flows through a drain and a source of transistor N300. In some embodiments, voltage VREF is set at the ground reference. By operation of NMOS transistor N300, a change in voltage VD at the gate of transistor N300 results in a corresponding change in a voltage drop across the gate and the source of transistor N300, and also a change in current ID2. Effectively, NMOS transistor N300 provides a change in a current value of current ID2 based on a change in a voltage value of voltage VD. For example, when the absolute value of voltage VD increases, the absolute value of current ID2 increases by operation of transistor N300.

Current Bias

FIG. 4 is a diagram of a circuit 400, in accordance with some embodiments. Circuit 400 is an implementation of current bias 130 in FIG. 1. Based on voltage VCOIN, a PMOS transistor M1A generates a current flowing from a source to a drain of transistor M1A, which, effectively, is a current IM1B that flows from a drain to a source of an NMOS transistor M1B. NMOS transistors M1B and M1C form a current mirror. Gates of transistors M1B and M1C are coupled together and to the drain of transistor M1B. Current IM1B flows through the drain of transistor M1B while a current ID1 flows through a drain of transistor M1C. As a result, current ID1 equals current IM1B. In some embodiments, a value of current ID1 is determined, resulting in a corresponding value of current IM1B. Voltage VCOIN is adjusted to provide current IM1B. Effectively, current ID1 is provided based on voltage VCOIN.

Application Circuit

Figure 5:
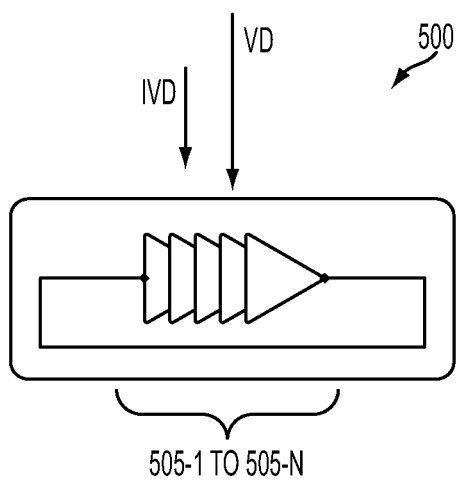
FIG. 5 is a diagram of a circuit implementing the application circuit in FIG. 1, in accordance with some embodiments.

FIG. 5 is a diagram of a circuit 500, in accordance with some embodiments. Circuit 500 is an embodiment of application circuit 140 in FIG. 1. Circuit 500 is formed by a plurality of inverters 505-1 to 505-N in which N is an odd number. Circuit 500 is called a ring oscillator or a current controlled oscillator (CCO), and functions based on current IVD and voltage VD provided by regulating cascode circuit 105 in FIG. 1.

Figure 6:
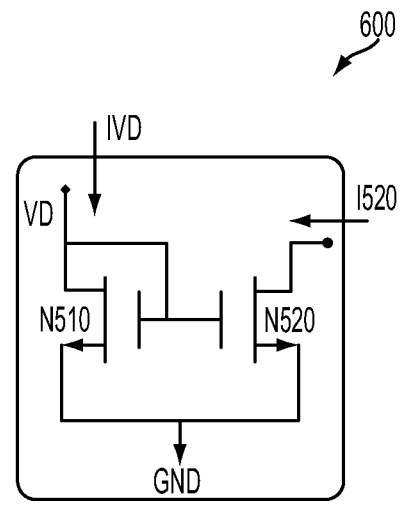
FIG. 6 is a diagram of a circuit implementing the application circuit in FIG. 1, in accordance with some further embodiments.

FIG. 6 is a diagram of a circuit 600, in accordance with some embodiments. Circuit 600 is another embodiment of application circuit 140 in FIG. 1. Circuit 600 includes NMOS transistors N510 and N520 that form a current mirror. Gates of transistors N510 and N520 are coupled together and to a drain of transistor N510. Current IVD and voltage VD are provided by regulating cascode circuit 105 in FIG. 1. A current I520 equals to current IVD. As a result, in some embodiments, a current value of current I520 is predetermined, and voltage VCOIN in FIG. 1 is adjusted to provide a corresponding value of current IVD. Effectively, the predetermined value of current I520 is provided based on voltage VCOIN and current IVD.

Circuit Having a Cascode Core, Some Further Embodiments

Figure 7:
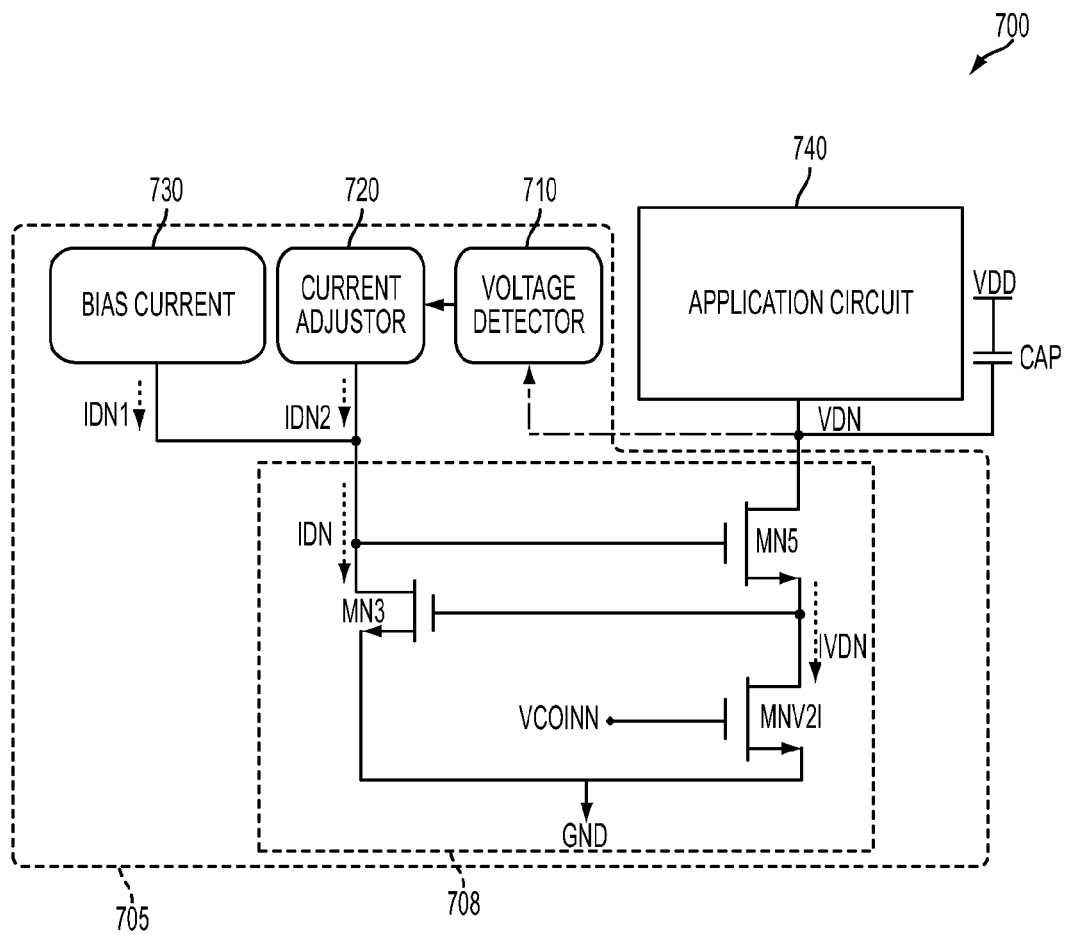
FIG. 7 is a diagram of a circuit having a cascode core circuit, in accordance with some further embodiments.

FIG. 7 is a diagram of a circuit 700 in which transistors MN3, MNV2I, and MN5 in cascode core circuit 708 are NMOS transistors, in accordance with some embodiments.

Compared with circuit 100 in FIG. 1, voltage detector 710, current adjustor 720, current bias 730, and application circuit 740 correspond to voltage detector 110, current adjustor 120, current bias 130, and application circuit 140 in FIG. 1, respectively. Capacitor CAPN corresponds to capacitor CAP. Currents IDN1, IDN2, IDN, and IVDN correspond to currents ID1, ID2, ID, and IVD, respectively. Voltages VDN and VCOINN correspond to voltages VD and VCOIN, respectively.

To avoid obscuring the drawing, voltages VdMNV2I, VdsMNV2I, VgsMN3, VdsMN5, VthMNV2I, VthMN5, VodMNV2I, and VodMN5 are not shown. Voltage VdMNV2I is the voltage at the drain of transistor MNV2I. Voltage VdsMNV2I is the voltage drop between the drain and the source of transistor MNV2I. Voltage VgsMN3 is the voltage drop between the gate and the source of transistor MN3. Voltage VdsMN5 is the voltage drop between the drain and the source of transistor MN5. Voltages VthMNV2I and VthMN5 are the threshold voltages of corresponding transistors MNV2I and MN5. Voltage VodMNV2I is an override voltage of transistor MNV2I, and voltage VodNM5 is an override voltage of transistor M5.

Circuit 700 includes a regulating cascode circuit 705 used in conjunction with an application circuit 740. Application circuit 740 receives and functions based on current IVDN provided by regulating cascode circuit 705. For example, when application circuit 740 is a current controlled oscillator (CCO), regulating cascode circuit 705 together with application circuit 740 functions as, and is called, a voltage controlled oscillator (VCO). In such a condition, voltage VDN at the drain of transistor MN5 is called the head voltage of the CCO. Capacitor CAPN is a load capacitor for application circuit 740, and is used to stabilize voltage VDN.

Regulating cascode circuit 705 receives voltage VCOINN and provides current IVDN to application circuit 740, and is therefore considered a current bias circuit for application circuit 740. Regulating cascode circuit 705 includes a cascode core 708, a voltage detector 710, a current adjustor 720, and a current bias 730.

Current IDN is called the operational current or bias current of cascode core circuit 708. Current IDN flows from a drain to a source of NMOS transistor MN3. Current IDN changes when voltage VgsMN3 changes, which in turn changes when voltage VDN changes. In other words, both current IDN and voltage VgsMN3 depend on voltage VDN. In some embodiments, when voltage VDN decreases, current IDN and voltage VgsM3 increase.

Current IVDN flows from the drain to the source of NMOS transistor MNV2I. When voltage VDN decreases, current IVDN increases. But when voltage VDN increases, current IVDN decreases.

Cascode core circuit 708 includes NMOS transistors MNV2I, MN3, and MN5 that perform the cascoding function of regulating cascode circuit 705. Transistors MNV2I and MN5 are connected in a series or a cascode manner. The source of NMOS transistor MNV2I receives a reference voltage or ground. The drain of NMOS transistor MNV2I is coupled to the source of NMOS transistor MN5. The drain of NMOS transistor MN5 provides voltage VDN for use by application circuit 740, and is called an output node of cascode core circuit 708. The gate of NMOS transistor MNV2I receives voltage VCOINN, and is called an input node of cascode core circuit 708. The drain of transistor MNV2I and the source of transistor MN5 are also coupled to the gate of transistor MN3. The drain of transistor MN3 is coupled to the gate of transistor MN5. The source of transistor MN3 receives a reference voltage or ground.

Cascode core circuit 708 functions as a voltage-to-current converter. For example, cascode core circuit 708, based on voltage VCOINN at the gate of transistor MNV2I, generates current IVDN, which flows from the drain to the source of transistor MNV2I. Current IVDN also flows through the drain and the source of transistor MN5, and is used by application circuit 740. For another example, when transistors MN3, MNV2I, and MN5 operate in the saturation mode, transistor MN3 functions as an amplifier. Transistor MN3 then forces voltage VdMNV2I at the drain of transistor MN2VI to be at a fixed voltage. As a result, current IVDN provided to application circuit 740 is a fixed current.

When transistor MN5 and/or transistor MNV2I operate out of the saturation mode into the triode mode, application circuit 740 operates in a slower frequency. In various embodiments, both transistors MNV2I and MN5 are designed such that transistors MNV2I and MN5 do not enter the triode mode, but remain in the saturation mode when voltage VCOINN increases and/or voltage VD decreases. In such a situation, application circuit 740 operates at the same frequency. For example, voltage VgsMN3 is designed to increase when voltage VCOINN increases and/or voltage VDN decreases. The absolute value of voltage VgsMN3 is designed to be greater than the absolute value of voltage VodMV2I so that transistor MNV2I operates in the saturation mode. Voltage VgsM3 is also designed such that voltage VDD−voltage VgsM3−voltage VDN is greater than voltage VodM5 so that transistor M5 operates in the saturation mode. For another example, in some embodiments, the absolute value |ΔVgsM3| of voltage ΔVgsM3 is designed to be substantially equal to the absolute value of voltage |ΔVD|. Effectively, the amount of decrease in voltage VDN is substantially the same as the amount of increase in voltage VgsM3.

When voltage VDN changes, voltage detector 710 detects the change in voltage VDN and provides the result to current adjustor 720, which adjusts current IDN2, or effectively, current IDN. For illustration, at a particular voltage VCOINN, transistors MNV2I and MN5 operate in the saturation mode.

Figure 9:
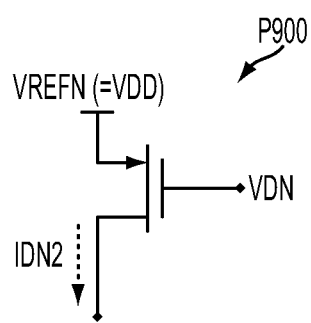
FIG. 9 is a diagram of a circuit functioning as a combined circuit of the voltage detector and the current adjustor in FIG. 8, in accordance with some embodiments.
Figure 10:
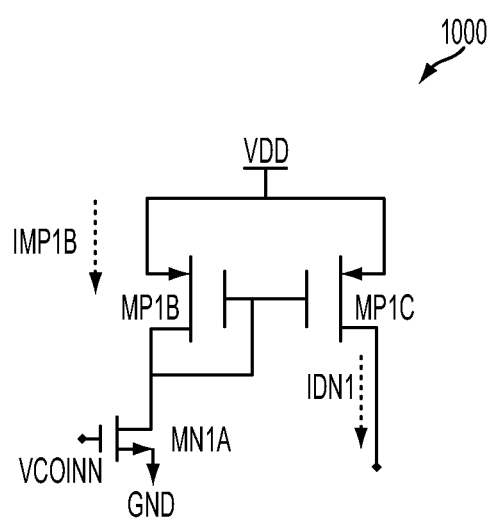
FIG. 10 is a diagram of a current bias in FIG. 7, in accordance with some embodiments.

For illustration, at a particular voltage VCOINN, transistors MV2I and M5 operate in the saturation mode. For various reasons, the VCO formed by regulating cascode circuit 705 and the CCO function as application circuit 740 slows down. Voltage VCOINN and current IVD are increased to compensate for the slow down of the VCO. In response to the increase of current IVDN, the CCO causes voltage VDN to decrease. Additionally, currents IVDN, IDN1, IDN2 decrease because $IVDN = KMNV2I^*(VgsMNV2I-VthMNV2I)^2 = KMNV2I^*(VCOINN-VthMNV2I)^2$ $IDN1 = KMN1A^*(VgsMN1A-VthMN1A)^2 = KMN1A^*(VCOINN-VthMN1A)^2$ $IDN2 = KP900^*(VsgP900-VthP900)^2 = KP900^*(VDD-VDN-VthP900)^2$ Where KMNV2I, KMN1A, and KP900 are constant values of corresponding transistors MNV2I, MN1A, and P900. Voltage VgsMN1A is a voltage drop across the source and the gate of transistor MN1A. Voltage VthMN1A is the threshold voltage of transistor MN1A. Voltage VsgP900 is a voltage drop across the source and the gate of transistor P900, and voltage VthP900 is the threshold voltage of transistor P900. Transistor P900 is shown in FIG. 9 while transistor MN1A is shown in FIG. 10.

Because current IDN is the difference between current IDN1 and IDN2 (IDN=IDN1−IDN2), current IDN increases, which causes voltage VgsMN3 and voltage VdsMNV2I to increase, and voltage VdsNM5 to decrease. In some embodiments, voltage VdsM5 is designed to decrease such that the absolute value of voltage VdsMN5 is greater than the absolute value of voltage VodMN5. As a result, transistor MN5 continues to operate in the saturation mode. In other word, transistor MN5 is prevented from leaving the saturation mode to enter the triode mode. At that time, transistor MNV2I continues to function in the saturation mode because the absolute value of voltage VgsM3 is greater than the absolute value of voltage VodMV2I. In some embodiments, the absolute value of voltage VdsMNV2I is designed to be higher than the absolute value of voltage VodMNV2I by a predetermined voltage margin VmMNV2I, such as 100 mV, in various operating PVT corners.

Various embodiments of the present disclosure are advantageous over other existing approaches in which the transistor corresponding to transistor MN5 and/or the transistor corresponding to transistor MNV2I enter the triode mode when voltage VDN decreases.

In some embodiments, voltage VDN in the SS corner is decreased compared with voltage VDN in the TT corner. Without mechanisms of the present disclosure, transistor MNV2I and/or transistor MN5 could operate in the triode mode when transistor MNV2I and/or transistor MN5 are in the SS corner. In various embodiments, both transistors MNV2I and MN5 are designed such that transistors MNV2I and MN5 do not enter the triode mode when transistor MNV2I and/or transistor MN5 are in the SS corner. For illustration, a change in voltage VDN from the TT corner to the SS corner is called voltage ΔVDN and is obtained through simulation. Further, the absolute value of voltage VgsMN3 in the SS corner is designed to be lower than the absolute value of voltage VgsMN3 in the TT corner. Stated differently, voltage VgsMN3 increases. The increase in voltage VgsMN3 from the TT corner to the SS corner is called voltage ΔVgsMN3. In some embodiments, ΔVgsMN3 is designed to compensate for ΔVDN. As a result, in the SS corner, transistors MV2I and M5 continue to operate in the saturation region.

In some embodiments, $VdsMNV2I = VgsMN3;$ $VdsMN5 = VDN - VdsMNV2I;$ and $VgsMN3 = \sqrt{\dfrac{IDN}{KMN3}} + VthMN3, KMN3 = \dfrac{1}{2}\mu Cox(W/L).$ Wherein VthMN3 is the threshold voltage of transistor MN3, KMN3 is a mathematical constant of transistor MN3, Cox is the oxide capacitance, μ is the electron mobility through the channel, W is the width, and L is the length of transistor MN3.

In various embodiments, each of the absolute values of voltage VdsMN5 and of voltage VdsMNV2I is designed to be greater than the absolute value of the corresponding override voltages VodMN5 and VodMNV2I to keep the corresponding transistors MN5 and MNV2I to operate in the saturation mode. In some embodiments, overdrive voltages VodMN5 and VodMNV2I are obtained through simulation.

Voltage detector 710 provides a voltage to current adjustor 720 based on voltage VDN. Current adjustor 720, based the voltage provided by voltage detector 710, adjusts current IDN2, and effectively, adjusts current IDN, to keep transistor MN5 operate in the saturation mode in desired conditions. Details of voltage detector 710 and current adjustor 720 are described with reference to FIG. 8 and FIG. 9.

Current bias 730 generates current IDN for cascode core circuit 708. Current bias 730 changes current IDN based on current IDN2. Current IDN is the difference between current IDN1 and current IDN2, and depends on voltage VDN at the drain of transistor MN5.

Various embodiments of the disclosure are advantageous over some existing approaches. In those existing approaches, the transistors in the cascoding core circuit operate out of the saturation mode into the triode mode in some PVT corners, such as at the temperature corner of −40° C. As a result, the total resistance of the cascoding core circuit in those existing approaches is reduced, resulting in a lower PSSR.

Further, transistors MNV2I and MN5 of the present disclosure operate in the saturation mode in the SS corner. For example, when transistors MNV2I and MN5 are in the SS corner, voltage VDN is decreased compared with voltage VDN in the SS corners. The operation of circuit 700 in response to the decrease in voltage VDN is explained above. In other words, voltage VgsMN3 is designed to increase to keep transistors MNV2I and MN5 to operate in the saturation mode as explained above. In contrast, in some existing approaches, transistors corresponding to transistors MNV2I and/or MN5 operate in the triode region in the SS corner.

Voltage Detector and Current Adjustor, Further Embodiments

Figure 8:
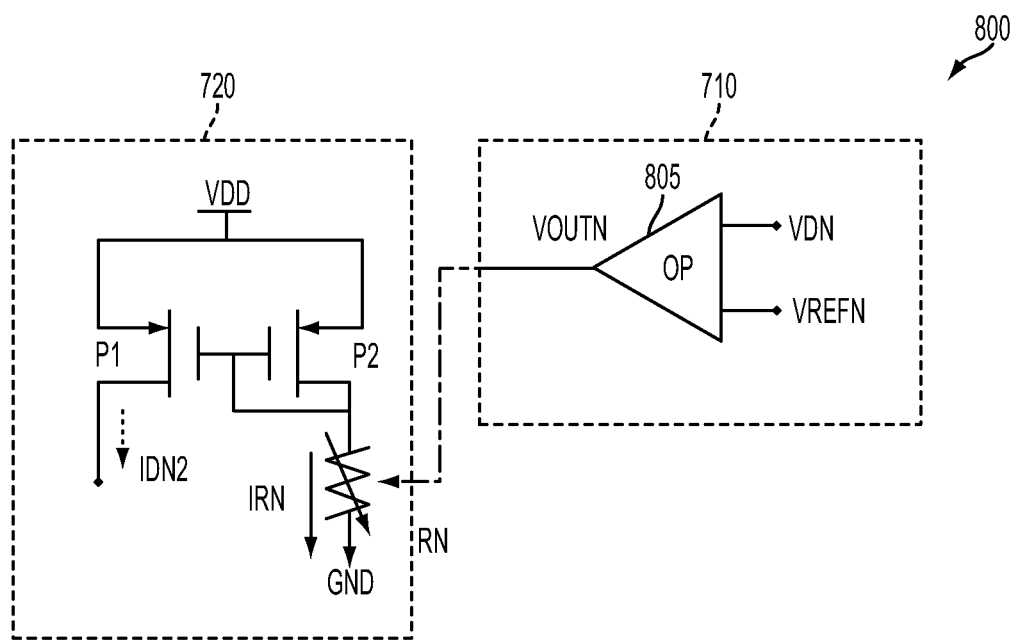
FIG. 8 is a diagram of a circuit implementing the voltage detector and the current adjustor in the circuit of FIG. 7, in accordance with some embodiments.

FIG. 8 is a diagram of a circuit 800, in accordance with some embodiments. Circuit 800 includes an implementation of voltage detector 710 and current adjustor 720 in FIG. 7.

Voltage detector 710 is implemented by an operational amplifier (OP) 805. OP 805 receives voltage VDN and a reference voltage VREFN as inputs and generates a voltage VOUTN. In some embodiments, voltage VREFN is selected to be 0 V so that voltage VOUTN is the difference between voltage VDN and voltage VREFN. Effectively, voltage VOUTN is a change in voltage VDN with reference to voltage VREFN.

Mathematically, $$VOUTN = VDN - VREFN.$$

Current adjustor 720 includes PMOS transistors P1, P2, and resistor RN. A current IDN2 flows through a drain of transistor P1. A current IRN flows through a drain of transistor P2. Transistors P1 and P2 form a current mirror because gates of transistors P1 and P2 are coupled together and to the drain of transistor P2. As a result, current IDN2 equals current IRN.

Resistor RN is a voltage controlled resistor wherein the resistance of resistor RN varies based on voltage VOUTN. A voltage value of voltage VOUTN results in a corresponding resistance value of resistor RN and a corresponding current value of current IRN. Because current IDN2 equals current IRN, a voltage value of voltage VOUTN results in a corresponding current value of current IDN2. As current IDN2 changes, current IDN in FIG. 7 also changes. Effectively, current adjustor 720 adjusts current IDN based on a change in voltage VDN with reference to reference voltage VREFN. For example, when voltage VDN decreases, voltage VOUTN decreases, and the resistance of resistor RN increases. A voltage dropped across resistor RN increases. A voltage dropped across a gate and a source of transistor P2, which is also a voltage dropped across a gate and a source of transistor P2, decreases. As a result, current IDN2 decreases.

FIG. 9 is a circuit diagram a PMOS transistor P900, in accordance with some embodiments. Transistor P900 functions as both voltage detector 710 and current adjustor 720 in FIG. 7. In other words, transistor P900 functions as circuit 800 in FIG. 8. A reference voltage VREFN is at a source of transistor P900 while voltage VDN is at a gate of transistor P900. Current ID2 flows through the drain and the source of transistor P900. In some embodiments, voltage VREFN is set at operational voltage VDD. By operation of PMOS transistor P900, a change in voltage VDN at the gate of transistor P900 results in a corresponding change in the voltage drop across the gate and the source of transistor P900, and also a change in current IDN2. Effectively, PMOS transistor P900 provides a change in a current value of current IDN2 based on a change in a voltage value of voltage VDN. For example, when voltage VDN decreases, by operation of transistor P900, current IDN2 decreases.

Bias Current, Further Embodiments

FIG. 10 is a diagram of a circuit 1000, in accordance with some embodiments. Circuit 1000 is an implementation of current bias 730 in FIG. 7. An NMOS transistor MN1A, based on voltage VCOINN, generates a current flowing from a drain to a source of transistor MN1A, which, effectively, is a current IMP1B that flows from a source to a drain of PMOS transistor MP1B. PMOS transistors MP1B and a PMOS transistor MP1C form a current mirror. Gates of transistors MP1B and MP1C are coupled together and to the drain of transistor MP1B. Current IMP1B flows through the drain of transistor MP1B while current IDN1 flows through a drain of transistor MP1C. As a result, current IDN1 equals current IMP1B. In some embodiments, a value of current IDN1 is determined, resulting in a corresponding value for current IMP1B. Voltage VCOINN is adjusted to provide current IMP1B. Effectively, current IDN1 is provided based on current VCOINN.

Application Circuit, Further Embodiments

FIG. 11 is a diagram of a circuit 1100, in accordance with some embodiments. Circuit 1100 is an embodiment of application circuit 740 in FIG. 7. Circuit 1100 is formed by a plurality of inverters 1105-1 to 1105-M in which M is an odd number. Circuit 1100 is called a ring oscillator or a current controlled oscillator (CCO), and functions based on current IVDN and voltage VDN.

FIG. 12 is a diagram of a circuit 1200, in accordance with some embodiments. Circuit 1200 is another embodiment of application circuit 740 in FIG. 7. Circuit 1200 includes PMOS transistors P1210 and P1220 that form a current mirror. Gates of transistors P1210 and P1220 are coupled together and to a drain of transistor P1210. Current IVDN and voltage VDN are from transistor MN5 in FIG. 7.

A current I1230 equals to current IVDN. As a result, in some embodiments, a current value of current I1230 is predetermined. Voltage VCOINN in FIG. 7 is adjusted to provide a corresponding value of current IVDN. Effectively, the predetermined value of current I1230 is provided based on voltage VCOINN and current IVDN.

Exemplary Methods

Figure 13:
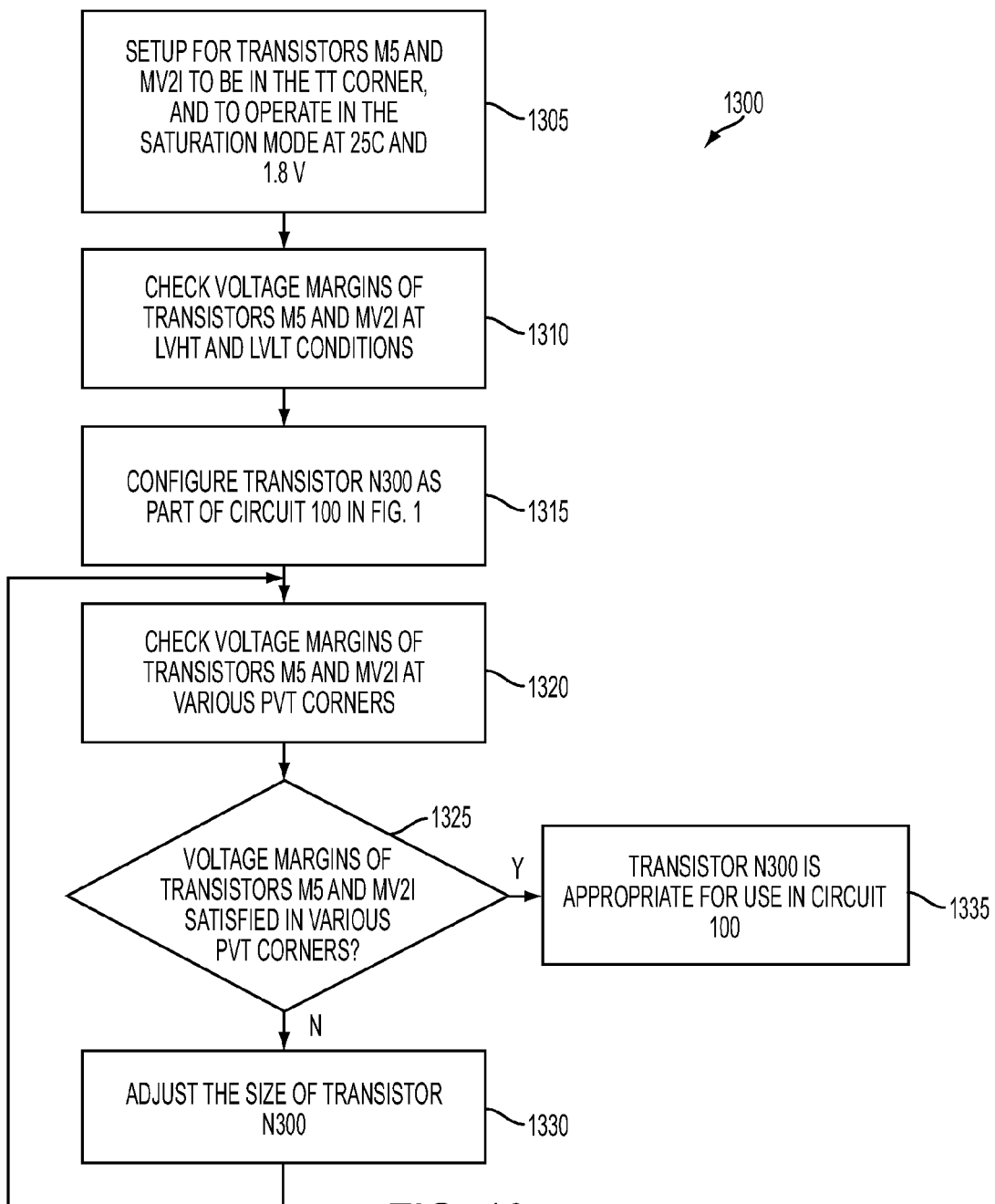
FIG. 13 is a flowchart of a method of selecting the transistor in FIG. 3, in accordance with some embodiments.

FIG. 13 is a flowchart of a method 1300 of selecting a transistor N300 in FIG. 3 for use in circuit 100 in FIG. 1, in accordance with some embodiments. In this illustration, bias current 130 and application circuit 140 are not used in circuit 100. Initially, transistor N300 is not connected to circuit 100.

In step 1305, transistors M5 and MV2I are set up by simulation to be in the TT corner, and to operate in the saturation mode. For example, the absolute value of voltage VsdM5 is setup to be greater than the absolute value of voltage VodM5. Similarly, the absolute value of voltage VsdMV2I is setup to be greater than the absolute value of voltage VodMv2I. An operating temperature is 25° C., and operational voltage VDD is at 1.8 V.

In step 1310, voltage margins VmM5 and VmMV2I of respective transistors M5 and MV2I are checked with a low voltage and a high temperature (LVHT) condition and the low voltage and a low temperature (LVLT) condition. In some embodiments, in the LVLT condition, operational voltage VDD is 90% of typical voltage VDD or 90% of 1.8 V, and the temperature is at 40° C. In the LVHT condition, operational voltage VDD is 90% of typical voltage VDD, and the temperature is at 125° C.

In step 1315, transistor N300 is configured as part of circuit 100 in FIG. 1.

In step 1320, voltage margins VmM5 and VmMV2I of corresponding transistors M5 and MV2I are checked by simulation at various PVT corners in which circuit 100 is expected to operate. Exemplary PVT corners are shown in FIG. 14.

In step 1325, it is determined whether voltage margins VmM5 and VmMV2I are satisfied in each of various PVT corners. For example, at a particular PVT corner, it is determined whether the absolute value of voltage VsdM5 is greater than the absolute value of voltage VodM5 by a predetermined voltage, such as 100 mV. Similarly, at a particular PVT corner, it is determined whether the absolute value of voltage VsdMV2I is greater than the absolute value of voltage VodMV2I by another predetermined voltage, such as 100 mV.

If voltage margins VmM5 and VmMV2I are not satisfied, the size of transistor N300 is changed in step 1330 to increase current ID2. For illustration W represents a width and L represents a length of transistor N300. In some embodiments, a ratio W/L of transistor N300 is increased to increase current ID2. Voltage margins VmM5 and VmMV2I are then checked again at various PVT corners in step 1320.

In step 1335, when voltage margins VmM5 and VmMV2I are acceptable, transistor N300 is selected for use in circuit 100. For example, at each PVT corner, the absolute value of voltage VsdM5 is greater than the absolute value of voltage VodM5 by the predetermined voltage of 100 mV. Similarly, at each PVT corner, the absolute value of voltage VsdMV2I is greater than the absolute value of voltage VodMV2I by the predetermined voltage of 100 mV. As a result, both transistors M5 and MV2I operate in the saturation mode in various PVT corners.

In the flow diagram shown in FIG. 13, transistor N300 as depicted in FIG. 3 is used in circuit 100 for illustration. When circuit 200 is used in place of transistor N300, the resistance of resistor R is adjusted in step 1330 to adjust current ID2 for voltage margins VmM5 and VmMV2I of corresponding transistors M5 and MV2I to be satisfied in various PVT corners. When transistor N900 is used in circuit 700, selecting transistor P900 for use in circuit 700 is similar to selecting transistor N300 for use in circuit 100. When circuit 800 is used in place of transistor P900 in circuit 700, the resistance of resistor RN is adjusted in step 1330 to adjust current IDN2 for voltage margins VmMN5 and VmMNV2I of corresponding transistors MN5 and MNV2I to be satisfied in various PVT corners.

FIG. 14 is a table 1400 illustrating various PVT corners used by circuit 100, in accordance with some embodiments. The device process column corresponds to the letter P in the reference "PVT." The supply voltage column corresponds to the letter V, and the temperature column corresponds to the letter T. As illustratively shown in FIG. 14, at each process corner TT, SS, and FF, operational voltage value VDD, 90% of voltage VDD value, and 110% of voltage VDD value are used. At each operational voltage value, temperatures 25° C., 125° C. and −40° C. are used. In some embodiments, typical operational voltage VDD value is at 1.8 V.

Figure 15:
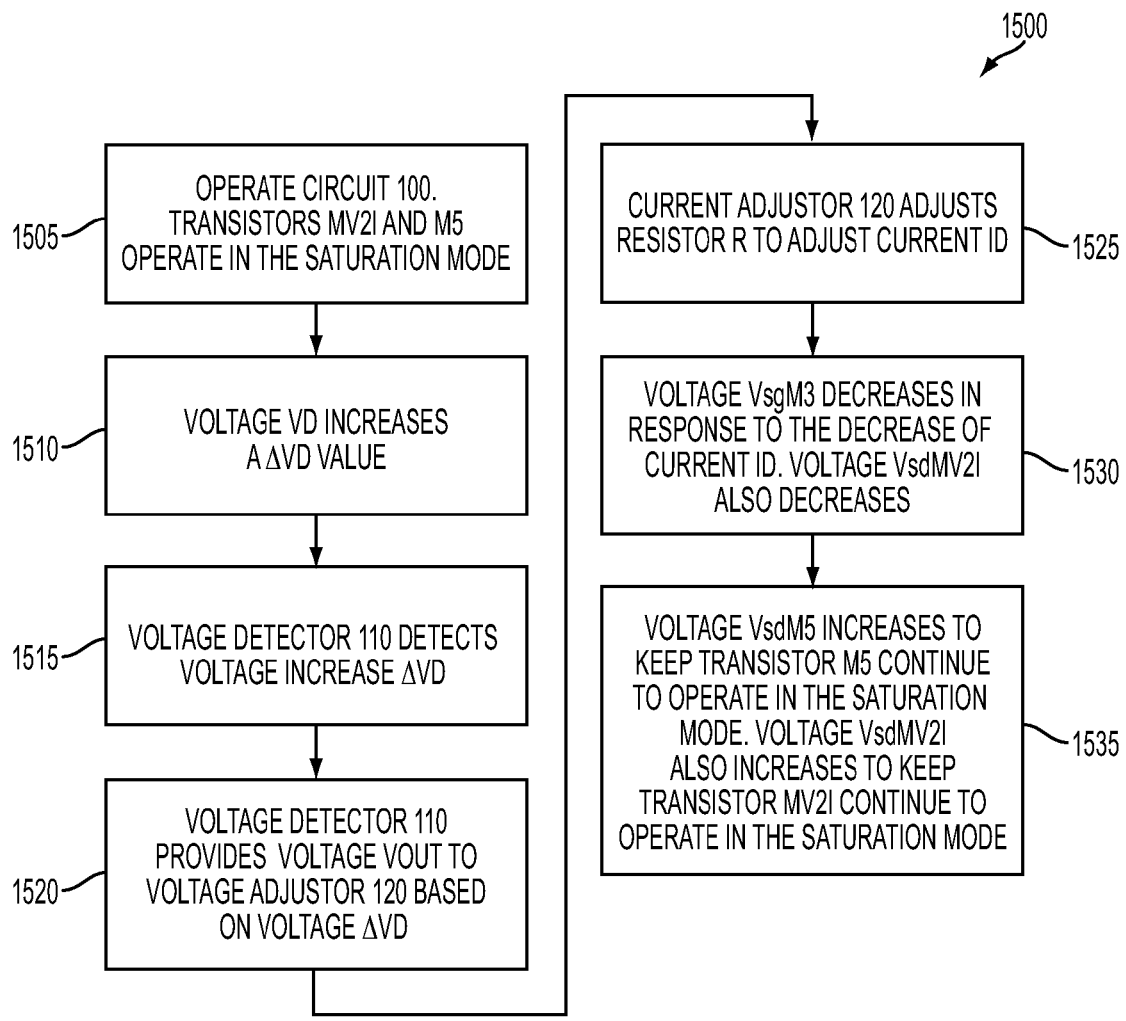
FIG. 15 is a flowchart of a method illustrating an operation of the circuit in FIG. 1, in accordance with some embodiments.

FIG. 15 is a flow chart of a method 1500 illustrating an operation of circuit 100, in accordance with some embodiments. In this illustration, circuit 200 in FIG. 2 is used to function as voltage detector 110 and current adjustor 120 in FIG. 1.

In operation 1505, circuit 100 is operated. For illustration, both transistors MV2I and M5 operate in the saturation mode.

In operation 1510, for illustration, the absolute value of voltage VD increases a voltage value ΔVD.

In operation 1515, voltage detector 110 detects the increase ΔVD of voltage VD.

In operation 1520, voltage detector 110 provides voltage VOUT in FIG. 2 to voltage adjustor 120 based on voltage ΔVD. In some embodiments, voltage VREF is 0 V. Voltage VOUT is therefore ΔVD.

In operation 1525, current adjustor 120 adjusts resistor R, and generates corresponding currents IR and current ID2. Because ID=ID1−ID2, current adjustor 120, effectively, adjusts current ID2 and current ID. In some embodiments, current ID2 increases and current ID therefore decreases when the absolute value of voltage VD increases.

In operation 1530, the absolute value of voltage VsgM3 decreases in response to the decrease in the absolute value of current ID. The absolute value of voltage VsdMV2I also decreases.

In operation 1535, the absolute value of voltage VsdM5, which is VDD−VsgM3−VD, increases such that the absolute value of voltage VsdM5 is greater than the absolute value of voltage VodM5, which is VsgM5−VthM5. As a result, transistor M5 continues to operate in the saturation mode. At the same time, the absolute value of voltage VsdMV2I also increases to be greater than the absolute value of voltage VodMV2I such that transistor MV2I continues to operate in the saturation mode.

In the illustration of FIG. 15, circuit 200 in FIG. 2 is used in circuit 100. When transistor N300 is used in place of circuit 200, the operation of circuit 100 is similar. An operation of circuit 700 when the absolute value of voltage VDN decreases to keep transistors MNV2I and MN5 continue operating in the saturation mode is similar to the operation of circuit 100 when the absolute value of voltage VD increases to keep transistors MV2I and M5 continue operating in the saturation mode.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration. Embodiments of the disclosure are not limited to a particular type. Selecting different dopant types for a particular transistor is within the scope of various embodiments. The low or high logical level of various signals used in the above description is also for illustration. Various embodiments are not limited to a particular level when a signal is activated and/or deactivated. Selecting different levels is within the scope of various embodiments.

In some embodiments, a circuit comprises a cascode core circuit and a current adjustor circuit. The cascode core circuit has an output node and a current path (ID). The current adjustor circuit is configured to change a current on the current path in response to a change in a voltage at the output node. The cascode core circuit comprises a first transistor, a second transistor, and a third transistor. A first terminal of the first transistor is coupled to a second terminal of the second transistor and to a third terminal of the third transistor. A first terminal of the second transistor is configured as the output node. A first terminal of the third transistor is coupled to a third terminal of the second transistor. The current path is through the first terminal of the third transistor.

In some embodiments, in a method of operating a cascode core circuit having a first transistor, a second transistor, and a third transistor, each of the first transistor and the second transistor of the cascode core circuit is operated in a saturation mode. The first transistor and the second transistor are continued to operate in the saturation mode in which a current of the cascode core circuit is adjusted in response to a change in a voltage at a first terminal of the second transistor. A first terminal of the first transistor is coupled to a second terminal of the second transistor and to a third terminal of the third transistor. A first terminal of the third transistor is coupled to a third terminal of the second transistor. The current of the cascode core circuit flows through the first terminal of the third transistor.

In some embodiments, a method of configuring a current adjustor for use with a cascode core circuit that includes a first transistor, a second transistor, and a third transistor is performed. In the method, each of the first transistor and the second transistor are operated in a first condition in which the first transistor and the second transistor each operate in a saturation mode at a first temperature and at a first operational voltage value. A current value of the current adjustor is selected such that the first transistor and the second transistor each operate in a second condition and in a third condition. In the second condition, the first transistor and the second transistor each operate in the saturation mode, at a second operational voltage value lower than the first operational voltage value, and at a second temperature higher than the first temperature. In the third condition, the first transistor and the second transistor each operate in the saturation mode, at a third operational voltage lower than the first operational voltage value, and at a third temperature lower than the first temperature. A first terminal of the first transistor is coupled to a second terminal of the second transistor and to a third terminal of the third transistor. A first terminal of the third transistor is coupled to a third terminal of the second transistor. A current path is through the first terminal of the third transistor. A current on the current path is adjusted based on a voltage at a first terminal of the second transistor and by the current value of the current adjustor.

In various embodiments, a transistor functions as a switch. A switching circuit used in place of a transistor is within the scope of various embodiments. Various figures show resistors and capacitors for illustration. Equivalent circuitry may be used. For example, a resistive device, circuitry or network such as a combination of resistors, resistive devices, circuitry, etc., can be used in place of the resistor. Similarly, a capacitive device, circuitry or network such as a combination of capacitors, capacitive devices, circuitry, etc., can be used in place of the capacitor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a cascode core circuit having an output node and a current path; and
a current adjustor circuit configured to change a current on the current path in response to a change in a voltage at the output node, and a first reference voltage,
wherein the cascode core circuit comprises a first transistor, a second transistor, and a third transistor, a first terminal of the first transistor is coupled to a second terminal of the second transistor and to a third terminal of the third transistor; a first terminal of the second transistor is configured as the output node of the cascode core circuit;
a first terminal of the third transistor is coupled to a third terminal of the second transistor; and the current path is through the first terminal of the third transistor.

2. The circuit of claim 1, wherein
the first transistor, the second transistor, and the third transistor are each a PMOS transistor; or
the first transistor, the second transistor, and the third transistor are each an NMOS transistor.

3. The circuit of claim 1, wherein
the current adjustor circuit includes a fourth transistor;
a first terminal of the fourth transistor is coupled to the current path; and
a third terminal of the fourth transistor is coupled to the output node of the cascode core circuit.

4. The circuit of claim 3, wherein
the first transistor, the second transistor, and the third transistor are each a PMOS transistor, and the fourth transistor is an NMOS transistor; or
the first transistor, the second transistor, and the third transistor are each an NMOS transistor, and the fourth transistor is a PMOS transistor.

5. The circuit of claim 3, wherein a second terminal of the fourth transistor is configured to receive a second reference voltage.

6. The circuit of claim 1, further comprising:
a voltage detector configured to provide a voltage to the current adjustor circuit based on the change in the voltage at the output node of the cascode core circuit,
wherein the current adjustor circuit comprises
a current mirror coupled to the current path at a first node of the current mirror; and
an adjustable resistive device coupled to a second node of the current mirror and configured to generate a current corresponding to the voltage provided by the voltage detector.

7. The circuit of claim 6, wherein
the voltage detector comprises an operational amplifier configured to receive the voltage at the output node of the cascode core circuit and the first reference voltage, and to provide the voltage to the current adjustor circuit based on the first reference voltage and on the voltage at the output node of the cascode core circuit.

8. The circuit of claim 1, wherein
the circuit is coupled with a current controlled oscillator at the output node of the cascode core circuit; and
the circuit and the current controlled oscillator are configured to function as a voltage controlled oscillator.

9. The circuit of claim 1, wherein
the first terminal of the first transistor is directly electrically connected to the second terminal of the second transistor and to the third terminal of the third transistor, the first terminal of the third transistor is directly electrically connected to the third terminal of the second transistor, and the third terminal of the third transistor is different from the first terminal of the third transistor.

10. A method of configuring a current adjustor for use with a cascode core circuit that includes a first transistor, a second transistor, and a third transistor, the method comprising:

operating each of the first transistor and the second transistor in a first condition, wherein in the first condition, the first transistor and the second transistor each operate in a saturation mode at a first temperature and at a first operational voltage value; and selecting a current value of the current adjustor such that the first transistor and the second transistor each operate in a second condition, and in a third condition, wherein, in the second condition, the first transistor and the second transistor each operate in the saturation mode, at a second operational voltage value lower than the first operational voltage value, and at a second temperature higher than the first temperature, and in the third condition, the first transistor and the second transistor each operate in the saturation mode, at a third operational voltage lower than the first operational voltage value, and at a third temperature lower than the first temperature;

a first terminal of the first transistor is coupled to a second terminal of the second transistor and to a third terminal of the third transistor;

a first terminal of the third transistor is coupled to a third terminal of the second transistor;

a current path is through the first terminal of the third transistor; and a current on the current path is adjusted based on a voltage at a first terminal of the second transistor and by the current value of the current adjustor.

11. The method of claim 10, wherein the second operational voltage value equals the third operational voltage value.

12. The method of claim 10, wherein the current adjustor includes a fourth transistor; and selecting the current value of the current adjustor includes selecting a size of the fourth transistor.

13. The method of claim 10, wherein the current adjustor includes a current mirror coupled with a resistive device; and selecting the current value of the current adjustor includes selecting a value of the resistive device based on the voltage at the first terminal of the second transistor.

14. A method of operating a cascode core circuit having a first transistor, a second transistor, and a third transistor, the method comprising:

operating each of the first transistor and the second transistor in a saturation mode; and continuing to operate the first transistor and the second transistor in the saturation mode by adjusting a current of the cascode core circuit in response to a change in a voltage at a first terminal of the second transistor, and a reference voltage at a current adjustor circuit wherein a first terminal of the first transistor is coupled to a second terminal of the second transistor and to a third terminal of the third transistor; the first terminal of the second transistor is configured as an output node of the cascode core circuit; a first terminal of the third transistor is coupled to a third terminal of the second transistor; and the current of the cascode core circuit flows through the first terminal of the third transistor.

15. The method of claim 14, wherein adjusting the current of the cascode core circuit comprises using a fourth transistor;

a first terminal of the fourth transistor is coupled to the first terminal of the third transistor; and a third terminal of the fourth transistor is configured to receive the voltage at the first terminal of the second transistor.

16. The method of claim 15, wherein the first transistor, the second transistor, and the third transistor are each a PMOS transistor, and the fourth transistor is an NMOS transistor; or the first transistor, the second transistor, and the third transistor are each an NMOS transistor, and the fourth transistor is a PMOS transistor.

17. The method of claim 14, wherein adjusting the current of the cascode core circuit comprises using a current mirror;

a first node of the current mirror is coupled to a current path having the current of the cascode core circuit; and a second node of the current mirror is configured to produce a current based on the change in the voltage at the first terminal of the second transistor.

18. The method of claim 17, wherein the current produced at the second node of the current mirror is based on a variable resistor; and the change in the voltage at the first terminal of the second transistor corresponds to a value of the variable transistor.

19. The method of claim 17, wherein adjusting the current of the cascode core circuit further comprises using an operational amplifier;

the operational amplifier provides a voltage based on the change in the voltage at the first terminal of the second transistor; and the current mirror produces the current at the second node based on the voltage provided by the operational amplifier.

20. The method of claim 14, wherein adjusting the current of the cascode core circuit in response to the change in the voltage at the first terminal of the second transistor satisfies at least one of the following conditions $$V1-V2-V3>V4$$

where voltage V1 is an operational voltage value applied at a second terminal of the first transistor; voltage V2 is a voltage value drop across a second and a third terminal of the third transistor; voltage V3 is a voltage value at the first terminal of the second transistor; and voltage V4 is an overdrive voltage of the second transistor; or $$VN3-VN2>VN4$$

where voltage VN2 is a voltage value drop across the third and the second terminal of the third transistor; voltage VN3 is a voltage value at the first terminal of the second transistor; and voltage VN4 is the overdrive voltage of the second transistor.

* * * * *